US010409121B2

(12) United States Patent
Peng

(10) Patent No.: US 10,409,121 B2
(45) Date of Patent: Sep. 10, 2019

(54) ARRAY SUBSTRATE AND DISPLAY DEVICE INCLUDING THE SAME

(71) Applicant: Xiamen Tianma Micro-Electronics Co., Ltd., Xiamen (CN)

(72) Inventor: Tao Peng, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 121 days.

(21) Appl. No.: 15/798,859

(22) Filed: Oct. 31, 2017

(65) Prior Publication Data

US 2018/0314120 A1  Nov. 1, 2018

(30) Foreign Application Priority Data

Apr. 28, 2017 (CN) .......................... 2017 1 0295964

(51) Int. Cl.
*G06F 3/041* (2006.01)
*G06F 3/044* (2006.01)
(Continued)

(52) U.S. Cl.
CPC ...... *G02F 1/136204* (2013.01); *G02F 1/1368* (2013.01); *G02F 1/13338* (2013.01); *G02F 1/134363* (2013.01); *G02F 1/136227* (2013.01); *G02F 1/136286* (2013.01); *G06F 3/044* (2013.01); *G06F 3/0412* (2013.01);
(Continued)

(58) Field of Classification Search
CPC .......... G02F 1/136204; G02F 1/13338; G02F 1/134363; G02F 1/136227; G02F 1/136286; G02F 1/1368; G06F 3/0412; G06F 3/0416; G06F 3/044; H01L 27/0266;
(Continued)

(56) References Cited

U.S. PATENT DOCUMENTS

| 2014/0160066 A1* | 6/2014 | Kim | G06F 3/0412 |
| | | | 345/174 |
| 2016/0026044 A1* | 1/2016 | Nam | G02F 1/1368 |
| | | | 349/42 |

FOREIGN PATENT DOCUMENTS

| CN | 102411238 A | 4/2012 |
| CN | 102750024 A | 10/2012 |

OTHER PUBLICATIONS

Chinese OA dated Mar. 19, 2019 for corresponding CN Application No. 201710295964.7.

\* cited by examiner

*Primary Examiner* — Robert J Michaud
(74) *Attorney, Agent, or Firm* — Tarolli, Sundheim, Covell & Tummino LLP

(57) ABSTRACT

Provided are a display device and an array substrate including: base substrate; first metal layer; second metal layer at a side of first metal layer away from base substrate; third metal layer at a side of second metal layer away from base substrate; first insulation layer between first metal layer and second metal layer; second insulation layer between second metal layer and third metal layer; first oxide conductor layer at a side of third metal layer away from base substrate; second oxide conductor layer at a side of first oxide conductor layer away from base substrate; third insulation layer between first oxide conductor layer and third metal layer; and fourth insulation layer; in display area, fourth insulation layer is placed between first oxide conductor layer and second oxide conductor layer; in non-display area, third metal layer is connected with second metal layer at least by first oxide conductor layer.

20 Claims, 9 Drawing Sheets

(51) Int. Cl.
*G02F 1/1362* (2006.01)
*G02F 1/1343* (2006.01)
*H01L 27/12* (2006.01)
*G02F 1/1368* (2006.01)
*G02F 1/1333* (2006.01)
*H01L 27/02* (2006.01)
*H01L 27/32* (2006.01)
*H01L 29/786* (2006.01)

(52) U.S. Cl.
CPC ........ *G06F 3/0416* (2013.01); *H01L 27/0266* (2013.01); *H01L 27/0288* (2013.01); *H01L 27/124* (2013.01); *H01L 27/1244* (2013.01); *H01L 27/1248* (2013.01); *H01L 27/323* (2013.01); *H01L 27/3248* (2013.01); *H01L 27/3258* (2013.01); *G02F 2001/13685* (2013.01); *G02F 2001/134372* (2013.01); *G02F 2201/121* (2013.01); *G02F 2201/123* (2013.01); *G02F 2202/103* (2013.01); *G02F 2202/104* (2013.01); *G02F 2202/16* (2013.01); *G06F 2203/04107* (2013.01); *G06F 2203/04111* (2013.01); *H01L 27/1222* (2013.01); *H01L 27/3276* (2013.01); *H01L 29/78669* (2013.01); *H01L 29/78675* (2013.01)

(58) Field of Classification Search
CPC ............... H01L 27/0288; H01L 27/124; H01L 27/1244; H01L 27/1248; H01L 27/3258
See application file for complete search history.

ARRAY SUBSTRATE AND DISPLAY DEVICE INCLUDING THE SAME

CROSS-REFERENCE TO RELATED APPLICATIONS

The present application claims priority to Chinese Patent Application No. 201710295964.7, filed on Apr. 28, 2017, the content of which is incorporated herein by reference in its entirety.

TECHNICAL FIELD

The present disclosure relates to the field of display technologies and, specifically, relates to an array substrate, and a display device containing the array substrate.

BACKGROUND

A liquid crystal display (LCD) device has advantages of low energy consumption and portability, and has become a widely used display device. An organic electroluminesence display (OLED) device has advantages of wide angle of view, high contrast ratio and high response speed, and has become a mainstream display device of a new generation.

The array substrate is a necessary component for both the liquid crystal display device and the organic electroluminesence display device. At present, the array substrate includes a display area and a non-display area surrounding the display area. The display area includes a plurality of thin-film transistors distributed in an array, a plurality of data lines and a plurality of scan lines, the plurality of data lines and the plurality of scan lines are intersecting with and insulated from each other. The non-display area includes peripheral wirings of various types used for electrically connecting with the thin-film transistors, the data lines and the scan lines in the display area, a shift register circuit and an antistatic circuit, etc.

In recent years, a built-in touch display device has integrated the touch function and the display function, which is lighter and thinner as compared with the conventional add-on touch display device. Generally, an array substrate applied in the built-in touch display device includes a touch electrode having a lead wire, the lead wire is used for electrically connecting the touch electrode with a driving chip. In addition, since the lead wire readily generates static electricity during production, the lead wire of the prior art is connected to the antistatic circuit in the non-display area.

As for the commonly used in-plane switch (IPS) display mode and the fringe field switch (FFS) display mode, the touch electrode line is electrically connected with the driving chip in a bridging manner, and the touch electrode line is also electrically connected with the antistatic circuit in a bridging manner. In the prior art, before the final oxide conductor layer (which may be a pixel electrode or a common electrode) is formed, a mask is used to form a through-hole in the non-display area, then the touch electrode line is electrically connected with the antistatic circuit at the same time when the final oxide conductor layer is formed, and then the touch electrode line is electrically connected with the driving chip.

In the prior art, the touch electrode line is generally made of a metal material and is used as a third metal layer, and the electrical connection between the touch electrode and the antistatic circuit is realized by the electrical connection between the third metal layer and the source and drain electrodes (a second metal layer) of the thin-film transistor in the antistatic circuit; the electrical connection between the touch electrode line and the driving chip is realized by an electrical connection between the third metal layer and the second metal layer, and a further electrical connection between the second metal layer and the first metal layer (i.e., by a wire changing manner). However, the array substrate obtained in the above manner easily has poor contact problem, which causes that the array substrate is readily damaged by the static electricity, or the touch sensitivity is reduced.

SUMMARY

In view of the above, the present disclosure provides an array substrate and a display device, which realizes good contact between the touch electrode line and the antistatic circuit so as to improve the antistatic performance of the array substrate, and realizes good contact between the touch electrode and the driving chip so as to improve the touch sensitivity.

In one aspect, the present disclosure provides an array substrate, comprising: a base substrate, the base substrate comprising a display area and a non-display area; a first metal layer, located in the display area and the non-display area; a second metal layer, located at a side of the first metal layer away from the base substrate; a third metal layer, located at a side of the second metal layer away from the base substrate; a first insulation layer, placed between the first metal layer and the second metal layer; a second insulation layer, placed between the second metal layer and the third metal layer; a first oxide conductor layer, located at a side of the third metal layer away from the base substrate; a second oxide conductor layer, located at a side of the first oxide conductor layer away from the base substrate; a third insulation layer, located between the first oxide conductor layer and the third metal layer; and a fourth insulation layer; wherein in the display area, the fourth insulation layer is placed between the first oxide conductor layer and the second oxide conductor layer; in the non-display area, the third metal layer is electrically connected with the second metal layer at least by the first oxide conductor layer.

In another aspect, the present disclosure provides a display device including the array substrate as described above.

BRIEF DESCRIPTION OF DRAWINGS

In order to more clearly illustrate technical solutions in embodiments of the present disclosure, the accompanying drawings necessary for the embodiments are briefly introduced as follows. Obviously, the drawings described as follows are merely a part of the embodiments of the present disclosure, based on these drawings, other drawings can also be acquired by those skilled in the art without paying creative efforts.

DESCRIPTION OF EMBODIMENTS

In order to better understand the technical solutions of the present disclosure, embodiments of the present disclosure are described in detail as follows with reference to the accompanying drawings. It should be noted that, the described embodiments are merely a part of the embodiments of the present disclosure but not all of the embodiments. Based on the embodiments in the present disclosure, all other embodiments obtained by those skilled in the art without any creative efforts shall fall into the protection scope of the present disclosure.

In order to improve stability of the electrical connection between a third metal layer and a second metal layer, an embodiment of the present disclosure provides an array substrate. The array substrate includes: a base substrate, the base substrate including a display area and a non-display area; a first metal layer placed in the display area and the non-display area; a second metal layer located at a side of the first metal layer away from the base substrate; a third metal layer located at a side of the second metal layer away from the base substrate; a first insulation layer located between the first metal layer and the second metal layer; a second insulation layer located between the second metal layer and the third metal layer; a first oxide conductor layer located at a side of the third metal layer away from the base substrate; a second oxide conductor layer located at a side of the first oxide conductor layer away from the base substrate; a third insulation layer located between the first oxide conductor layer and the third metal layer; and a fourth insulation layer; wherein in the display area, the fourth insulation layer is placed between the first oxide conductor layer and the second oxide conductor layer; and in the non-display area, the third metal layer is connected with the second metal layer by at least the first oxide conductor layer.

Figure 1:
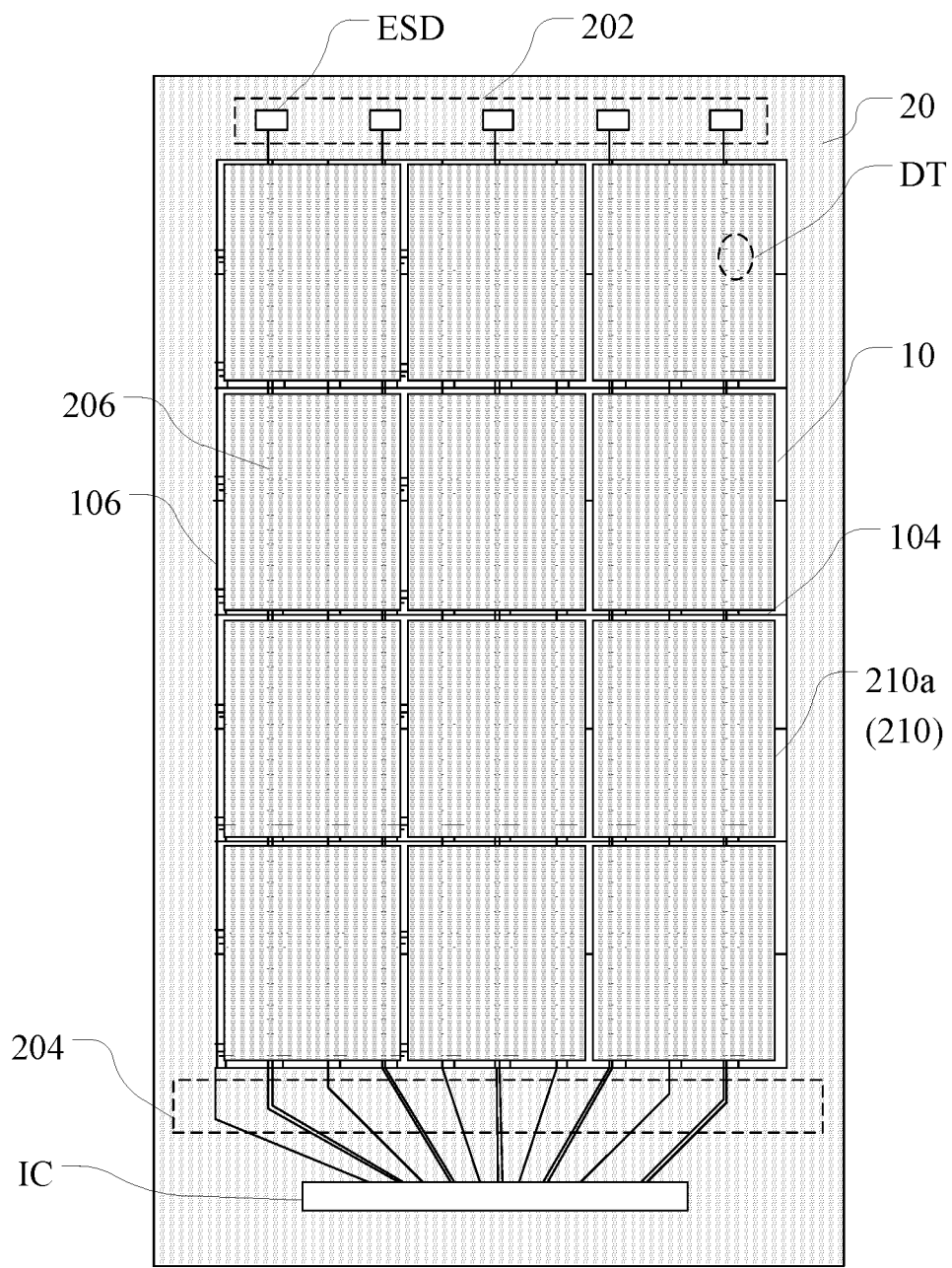
FIG. 1 illustrates a structural schematic diagram of an array substrate according to an embodiment of the present disclosure.
Figure 2:
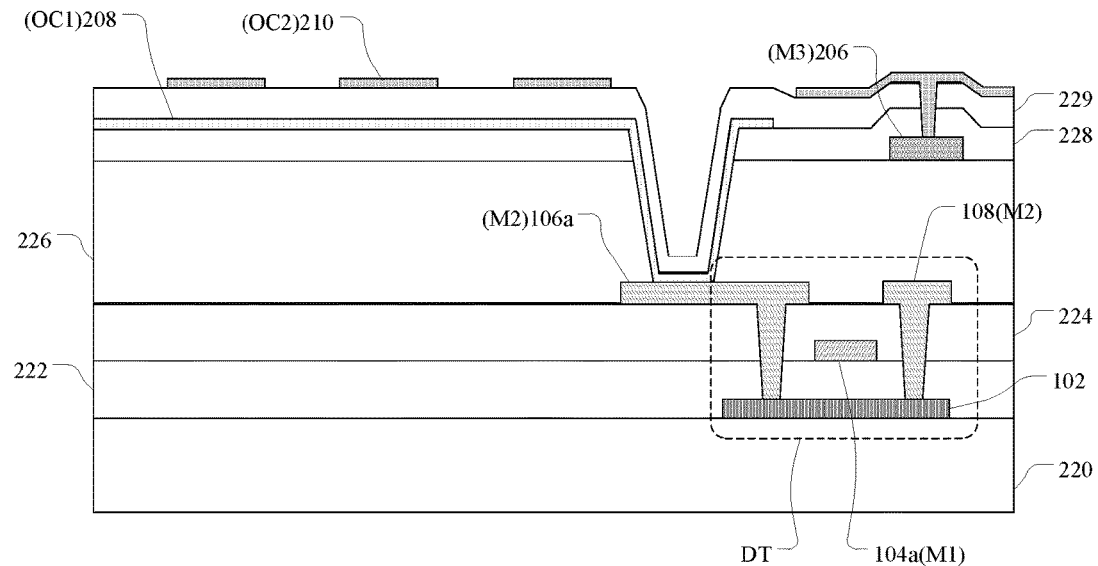
FIG. 2 illustrates a structural schematic diagram of a sub-pixel in a display area of the array substrate shown in FIG. 1.
Figure 3:
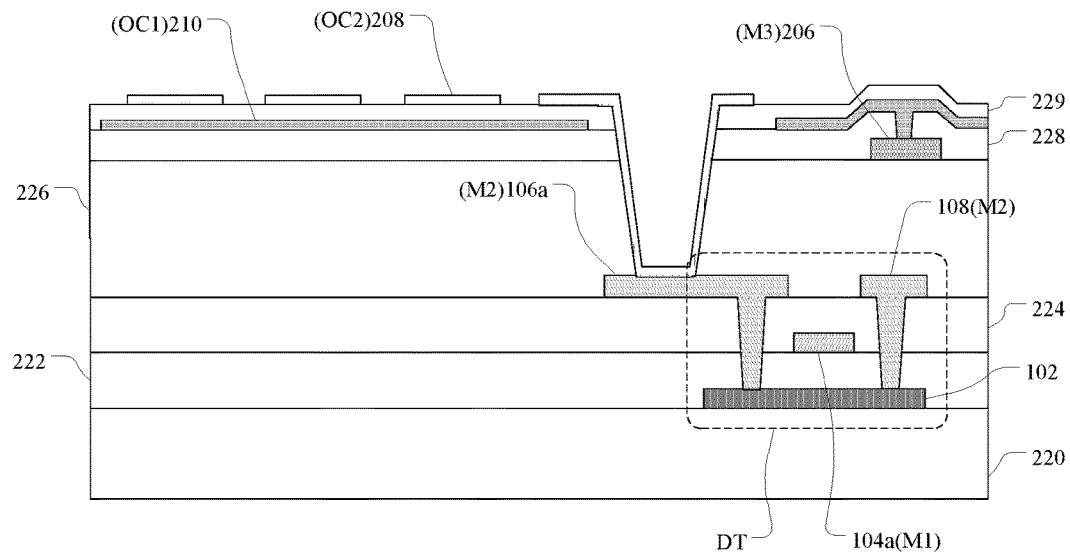
FIG. 3 illustrates another structural schematic diagram of a sub-pixel in the display area of the array substrate shown in FIG. 1.
Figure 4:
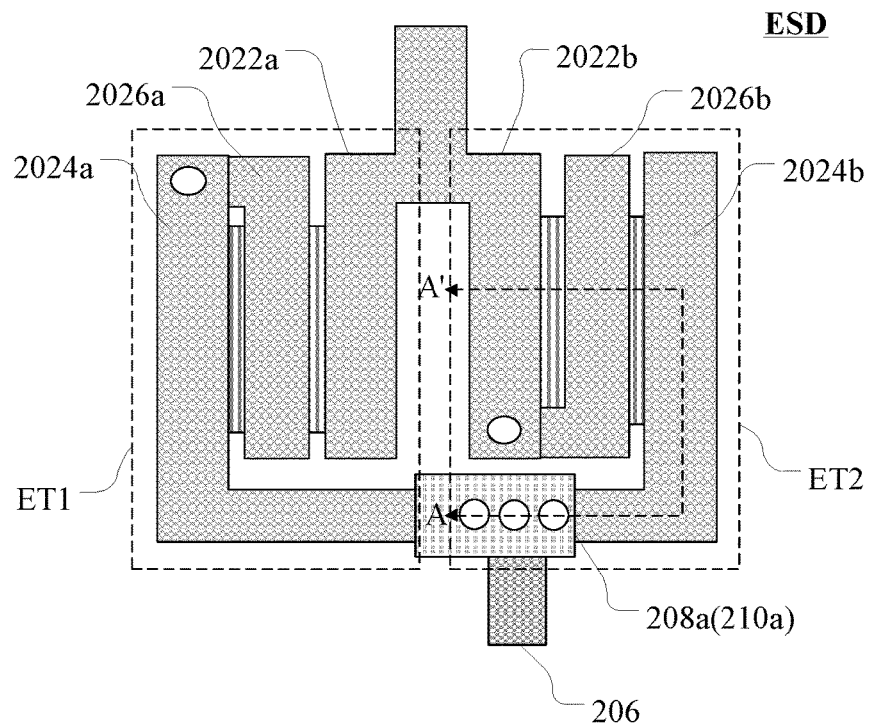
FIG. 4 illustrates a structural schematic diagram of an antistatic circuit unit in a non-display area of the array substrate shown in FIG. 1.
Figure 5:
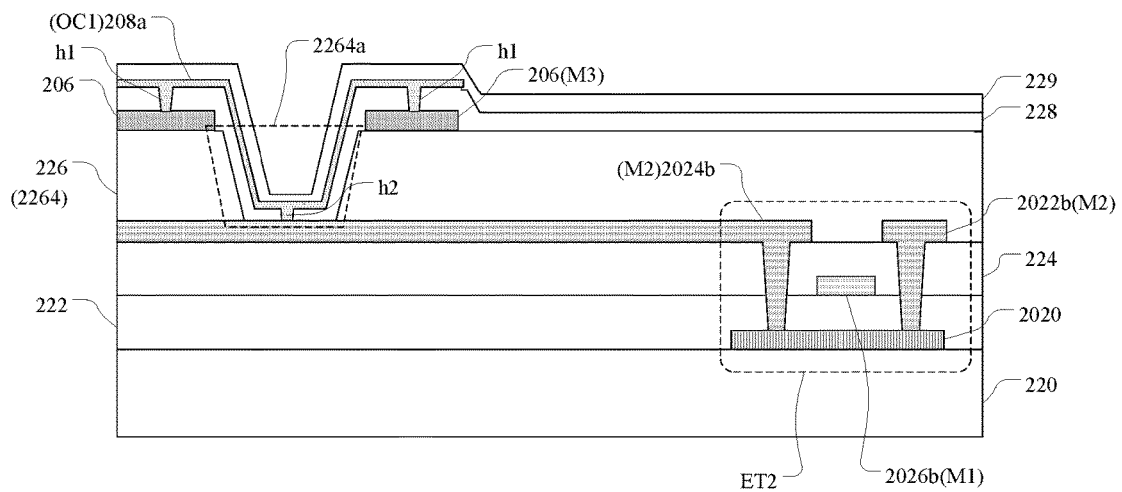
FIG. 5 illustrates a cross-sectional structural schematic diagram along AA' in FIG. 4.

Referring to FIGS. 1-5, FIG. 1 illustrates a structural schematic diagram of an array substrate according to an embodiment of the present disclosure; FIG. 2 illustrates a structural schematic diagram of a sub-pixel in a display area of the array substrate shown in FIG. 1; FIG. 3 illustrates another structural schematic diagram of a sub-pixel in the display area of the array substrate shown in FIG. 1; FIG. 4 illustrates a structural schematic diagram of an antistatic circuit unit in the non-display area of the array substrate shown in FIG. 1; and FIG. 5 illustrates a cross-sectional structural schematic diagram along AA' in FIG. 4.

As shown in FIG. 1 and FIG. 2, the array substrate includes a base substrate 220. The base substrate 220 includes a display area 10 and a non-display area 20. The array substrate further includes a plurality of display thin-film transistors DT (i.e., thin-film transistors for controlling display), a plurality of data lines 106, a plurality of gate lines 104 and a plurality of touch electrode lines 206, and the plurality of display thin-film transistors DT, the plurality of data lines 106, the plurality of gate lines 104 and the plurality of touch electrode lines 206 are placed in display area 10. Each display thin-film transistor DT includes a gate electrode 104a, a source electrode 106a, a drain electrode 108 and an active layer 102. The gate electrode 104a and the plurality of gate lines 104 are placed in a first metal layer M1, the source electrode 106a, the drain electrode 108 and the plurality of data lines 106 are placed in a second metal layer M2, and the plurality of touch electrode lines 206 is placed in a third metal layer M3. A pixel electrode 208 is placed at a side of the touch electrode line 206 away from the base substrate 220, a common electrode 210 is placed at a side of the pixel electrode 208 away from the base substrate 220, and the pixel electrode 208 is electrically connected with the source electrode 106a through a through-hole. Generally, both the pixel electrode 208 and common electrode 210 are conductors made of oxide material, for example, the pixel electrode 208 and the common electrode 210 are made of indium tin oxide (Indium Tin Oxide, ITO).

The common electrode 210 is electrically connected with the touch electrode line 206 through a through-hole. A first insulation layer 224 is placed between the first metal layer M1 (e.g., the gate electrode 104a and the gate line 104) and the second metal layer M2 (e.g., the source electrode 106a/drain electrode 108 and data line 106), and a second insulation layer 226 is placed between the second metal layer M2 (e.g., the source electrode 106a, drain electrode 108 and data line 106) and the third metal layer M3 (e.g., the touch electrode line 206); a third insulation layer 228 is placed between a first oxide conductor layer OC1 (e.g., the pixel electrode 208) and the third metal layer M3 (e.g., the touch electrode line 206). Further, in the display area 10, a fourth insulation layer 229 is placed between the first oxide conductor layer OC1 (e.g., the pixel electrode 208) and a second oxide conductor layer OC2 (e.g., the common electrode 210).

It should be noted that, though the first oxide conductor layer OC1 shown in FIG. 2 is the pixel electrode 208, and the second oxide conductor layer OC2 is the common electrode 210, the present disclosure are not limited thereto. For example, as shown in FIG. 3, the first oxide conductor layer can be the common electrode 210, and the second oxide conductor layer OC2 can be the pixel electrode 208. In the present disclosure, the first oxide conductor layer OC1 and the second oxide conductor layer OC2 can form a transverse electric field therebetween. When the array substrate provided by the present disclosure is applied in a liquid crystal display panel or a liquid crystal display device, the transverse electric field formed between the first oxide conductor layer OC1 and the second oxide conductor layer OC2 can control the liquid crystal to rotate, thereby achieving display.

It should be noted that, in FIG. 2 and FIG. 3, one of the pixel electrode 208 and the common electrode 210 has a plurality of strip-like openings in an area corresponding to one pixel, and the other one is a structure with an undivided surface in an area corresponding to one sub-pixel, which belongs to the fringe field switching (Fringe Field Switching, FFS) techniques. However, the present disclosure has no limitation on the mode of the electric field between the pixel electrode 208 and the common electrode 210. In other embodiments, the pixel electrode 208 and common electrode 210 can be arranged according to the in plane switch (In Plane Switch, IPS) techniques. For example, each of the pixel electrode 208 and the common electrode 210 has the strip-like opening in an area corresponding to the sub-pixel and, at the same time, the pixel electrode 208 serves as the first oxide conductor layer OC1, and the common electrode 210 serves as the second oxide conductor layer OC2, or, the common electrode 210 serves as the first oxide conductor layer OC1, and the pixel electrode 208 serves as the second oxide conductor layer OC2. When the pixel electrode 208 and the common electrode 210 are located in a same layer and are insulated from each other, the pixel electrode 208 and the common electrode 210 can serve as the first oxide conductor layer OC1 or the second oxide conductor layer OC2, and other electrodes, for example, a touch electrode, can serve as the second oxide conductor layer OC2 or the first oxide conductor layer OC1.

It should be noted that, in FIG. 2 and FIG. 3, the thin-film transistor is a low temperature poly-silicon type thin-film transistor, that is, the active layer 102 of the display thin-film transistor DT is made of low temperature poly-silicon material. As shown in FIG. 2 and FIG. 3, when the active layer 102 is made of low temperature poly-silicon material, the display thin-film transistor DT is generally configured into a top-gate structure, that is, the gate electrode 104a is located at a side of the active layer 102 away from the base substrate 220, and a gate electrode insulation layer 222 is placed between the active layer 102 and gate electrode 104a. However, the present disclosure has no limitation therein, in other embodiments, the active layer of the display thin-film transistor DT can also be made of amorphous silicon material or oxide semiconductor material. When the active layer is made of oxide semiconductor material, the oxide semiconductor material could be indium gallium zinc oxide (Indium Gallium Zinc Oxide, IGZO). In addition, the display thin-film transistor DT can also be configured into a bottom-gate structure. For example, when the active layer of the display thin-film transistor DT is made of amorphous silicon, the display thin-film transistor DT is configured into a bottom-gate structure.

Further, part of the non-display area of the array substrate as provided above is described in detail as follows. With reference to FIG. 1, FIG. 4 and FIG. 5, the non-display area 20 of the array substrate includes an antistatic circuit 202. The antistatic circuit 202 includes a plurality of electrostatic discharge protection structures ESD. Optionally, as shown in FIG. 4, each electrostatic discharge protection structure ESD includes two antistatic thin-film transistors ET1 and ET2, the source electrode 2022a of the antistatic thin-film transistor ET1 is electrically connected with the source electrode 2022b of the antistatic thin-film transistor ET2, the drain electrode 2024a of the antistatic thin-film transistor ET1 is electrically connected with the drain electrode 2024b of the antistatic thin-film transistor ET2. Further, the gate electrode 2026a of the antistatic thin-film transistor ET1 is electrically connected with the drain electrode 2024a of the antistatic thin-film transistor ET1, and the gate electrode 2026b of the antistatic thin-film transistor ET2 is electrically connected with the drain electrode 2024b of the antistatic thin-film transistor ET2. The touch electrode line 206 is electrically connected with the electrostatic discharge protection structure ESD through a through-hole. Optionally, the touch electrode line 206s are electrically connected with the electrostatic discharge protection structures ESD in one-to-one correspondence.

It should be noted that, an embodiment of the present disclosure further includes a touch electrode layer. The touch electrode layer includes a plurality of touch electrode units, and the plurality of touch electrode lines is electrically connected with the plurality of touch electrode units in the display area, and optionally, each touch electrode unit is electrically connected with at least one of the touch electrode lines. Therefore, the antistatic circuit in the present embodiment can conduct away the static electricity on the touch electrode block and the touch signal line in time, thereby protecting the touch electrode block and the touch signal line from being damaged by the static electricity. In some embodiments, the common electrode is also used as the touch electrode. For example, when the touch structure is a self-capacitance structure, the common electrode located in the first oxide conductor layer OC1 or the second oxide conductor layer OC2 can also be used as the touch electrode, the common electrode which is also used as the touch electrode includes a plurality of block-shaped common electrode units (touch electrode blocks); when the touch structure is a mutual capacitance structure, the common electrode can also be used as a touch driving electrode or a touch detecting electrode, and the common electrode which is also used as a touch driving electrode or a touch detecting electrode includes a plurality of strip-like common electrode blocks (touch driving electrode units or touch detecting electrode units). As shown in FIG. 1, the common electrode 210 is divided into a plurality of rectangular common electrode blocks 210a. FIG. 1 only illustrates a conventional configuration of the above self-capacitance mode, and the common electrode 210 in the present embodiment can also be divided into common electrode blocks 210a of other shapes, for example, rhombic, polygonal, and strip-like, etc.

Further, the configuration of the electrical connection between the touch electrode lines (the third metal layer M3) and the antistatic circuits can refer to FIG. 4 and FIG. 5. FIG. 5 illustrates a cross-sectional structural schematic diagram along AA' in FIG. 4. In the non-display area, the touch electrode line 206 is electrically connected with the drain electrode 2024b of the antistatic thin-film transistor ET2 by a connecting conductor, that is, the touch electrode line 206 is electrically connected with a connecting conductor 208a, the connecting conductor 208a is electrically connected with the drain electrode 2024b of the antistatic thin-film transistor ET2, and the fourth insulation layer 229 covers the connecting conductor 208a. The connecting conductor 208a located in the non-display area can be in a same layer where the pixel electrode 208 is located in the display area in FIG. 2, or in a same layer where the common electrode 210 is located in the display area in FIG. 3; the gate electrode 2026b of the antistatic thin-film transistor ET2 is placed in the first metal layer M1, the source electrode 2022b/drain electrode 2024b of the antistatic thin-film transistor ET2 is placed in the second metal layer M2, the connecting conductor 208a is placed in the first oxide conductor layer OC1, and the touch electrode line 206 located in the non-display area is in the third metal layer M3. Therefore, in the present disclosure, the third metal layer M3 is electrically connected, in the non-display area, with the second metal layer M2 by the connecting conductor 208a in the first oxide conductor layer OC1, and the fourth insulation layer 229 is arranged at a side of the first oxide conductor layer OC1 away from the base substrate 220, which prevents the connecting conductor 208a from being corroded in subsequent processing procedures, thereby improving stability of the electrical connection between the third metal layer M3 and the second metal layer M2. Therefore, the array substrate provided by the present embodiment can conduct away the static electricity on the touch electrode line 206 in the third metal layer M3, and on the touch electrode electrically connected with the touch electrode line 206, thereby preventing from static damage and improving touch sensitivity. Said "subsequent processing procedures" includes steps of forming the second oxide conductor layer OC2, attaching the array substrate provided in the present embodiment onto a corresponding substrate, and filling liquid crystal, etc.; or said "subsequent processing procedures" includes steps of forming the second oxide conductor layer OC2, and packaging, etc.

Optionally, in the array substrate, the second insulation layer placed between the second metal layer M2 and the third metal layer M3 includes a planarization layer having planarization function. As an implementation manner, the planarization layer is arranged to be thicker than any other insulation layer, for example, the first insulation layer 224, the third insulation layer 228 and the fourth insulation layer 229, thereby realizing the planarization function. Optionally, the planarization layer is made of organic material. The planarization layer includes a through-hole, and an orthogonal projection of the through-hole on the base substrate overlaps an orthogonal projection of the second metal layer M2 on the base substrate. As shown in FIG. 5, the second insulation layer 226 has only one insulation layer, i.e., the planarization layer 2264, and a through-hole 2264a is defined in the planarization layer 2264, the drain electrode 2024b of the antistatic thin-film transistor ET2 located in the second metal layer M2 is exposed via the through-hole 2264a. In addition, as shown in FIG. 5, a gate electrode insulation layer 222 is placed between the gate electrode 2026b and the active layer 2020.

It should be noted that, in some embodiments, the through-hole 2264a is defined in the planarization layer 2264, and the through-hole 2264a is not a deep hole which may be defined at the electrical connection position between the third metal layer M3 and the second metal layer M2 and penetrates through the planarization layer 2264, other film layers in the second insulation layer 226, and the third insulation layer 228. By providing the through-hole 2264a merely in the planarization layer 2264, it helps to avoid the connecting conductor 208a from crossing a possible deep hole, thereby reducing possibility of breakage of the connecting conductor 208a.

Optionally, in the above embodiments, a groove (not shown in the figures) is also defined in the planarization layer 2264. Generally, the planarization layer is the thickest insulation layer in the array substrate. In the non-display area of the array substrate, the groove is defined in the planarization layer, and the groove is used to prevent the alignment liquid from diffusing outwards during alignment of the array substrate. Said "diffusing outwards" refers to diffusing towards the edge of the array substrate. It should be noted that, the depth of the groove can be smaller than the thickness of the planarization layer 2264, or be equal to the thickness of the planarization layer 2264. Moreover, the through-hole 2264a of the planarization layer 2264 and the groove of the planarization layer 2264 can be formed by a same mask, for example, a common mask or a grayscale mask can be selected according to demands.

In some embodiments, the groove of the planarization layer 2264 can be shaped in a ring surrounding the non-display area, or be shaped in a plurality of strips surrounding the non-display area. It should be noted that, in some other embodiments, when the second insulation layer 226 has other insulation layer, the planarization layer 2264 can be merely arranged in the display area, or merely in the display area and part of the non-display area, however, the planarization layer 2264 in the non-display area has no groove. Though each of the above illustrated embodiments has the planarization layer 2264, the present disclosure is not limited thereto, and in some other embodiments, the second insulation layer 226 may not be provided with the planarization layer.

Further, with reference to FIG. 5, the first oxide conductor layer OC1 (the connecting conductor 208a in FIG. 5) is connected with the third metal layer M3 (the touch electrode line 206 in FIG. 5) through a first via-hole h1. The first oxide conductor layer OC1 is connected with the second metal layer (the drain electrode 2024b of the antistatic thin-film transistor ET2 in FIG. 5) through a second via-hole h2. The first via-hole h1 penetrates through the third insulation layer 228, and the second via-hole h2 penetrates through the second insulation layer 226 and the third insulation layer 228. An orthogonal projection of the second via-hole h2 on the base substrate 220 overlaps with an orthogonal projection of the through-hole 2264a of the planarization layer 2264 on the base substrate. It should be noted that, the second insulation layer 226 in FIG. 5 merely includes the planarization layer 2264, accordingly, the second via-hole h2 merely needs to penetrate through the third insulation layer 228 to realize that the third metal layer M3 is electrically connected with the second metal layer M2. However, when the second insulation layer 226 further has other insulation layer, the second via-hole h2 needs to penetrate through the other insulation layer; if the planarization layer having the through-hole 2264a is not placed in the second insulation layer, the second via-hole h2 needs to penetrate through the entire second insulation layer 226 to realize the electrical connection between the third metal layer M3 and the second metal layer M2.

Figure 6:
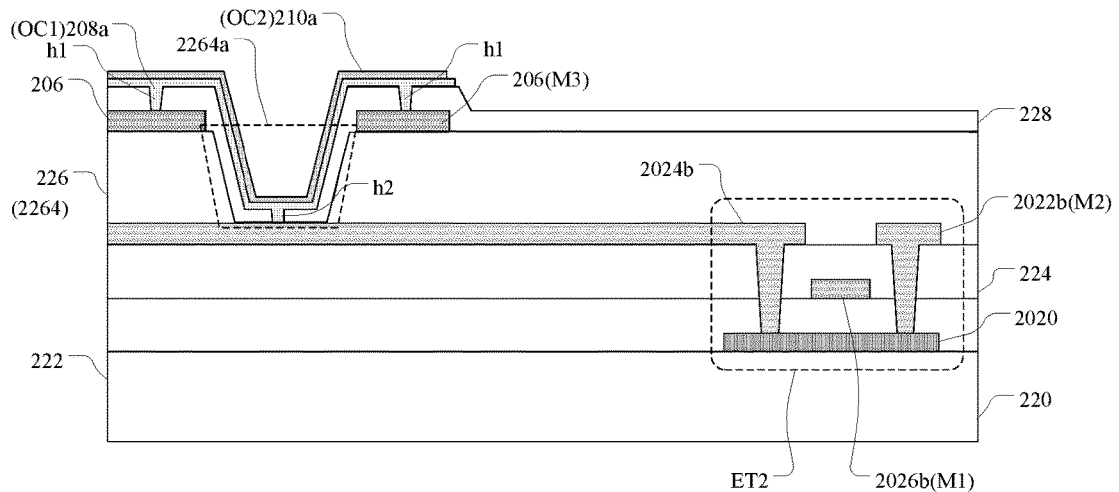
FIG. 6 illustrates another cross-sectional structural schematic diagram along AA' in FIG. 4.

Optionally, the third metal layer M3 is electrically connected with the second metal layer M2 by the first oxide conductor layer OC1 and the second oxide conductor layer OC2. That is, the configuration of electrical connection between the touch electrode line (the third metal layer M3) and the antistatic circuit can refer to FIG. 4 and FIG. 6. FIG. 6 illustrates another cross-sectional structural schematic diagram along AA' in FIG. 4. The structure shown in FIG. 6 is similar to the structure shown in FIG. 5, and the difference therebetween lies in connection manner between the third metal layer M3 and the second metal layer M2, and other similar configurations are not repeated herein. In the non-display area, the touch electrode line 206 is electrically connected with the drain electrode 2024b of the antistatic thin-film transistor ET2 by the connecting conductors 208a and an auxiliary connecting conductor 210a. For example, the touch electrode line 206 is electrically connected with the connecting conductor 208a through the first via-hole h1, the connecting conductor 208a is electrically connected with the drain electrode 2024b of the antistatic thin-film transistor ET2 through the second via-hole h2, and the auxiliary connecting conductor 210a directly contacts the connecting conductor 208a. It should be noted that, the connecting conductor 208a is placed in the first oxide conductor layer OC1, and the auxiliary connecting conductor 210a is placed in the second oxide conductor layer OC2.

It should be noted that, the second oxide conductor layer OC2 includes a first area and a second area. In the first area, the fourth insulation layer is placed between the second oxide conductor layer OC2 and the first oxide conductor layer OC1. In the second area, the second oxide conductor layer OC2 contacts the first oxide conductor layer OC1. An orthogonal projection of the second area on the base substrate overlaps with an orthogonal projection of the through-hole of the planarization layer on the base substrate. For example, in the display area, the first oxide conductor layer OC1 is insulated from the second oxide conductor layer OC2 by an insulation layer placed therebetween; in the non-display area, the connecting conductor 208a in the first oxide conductor layer OC1 contacts with the auxiliary connecting conductor 210a of the second oxide conductor layer OC2 to realize the electrical connection therebetween. In order to realize that the first oxide conductor layer OC1 is insulated from the second oxide conductor layer OC2 in the display area but is electrically connected with the second oxide conductor layer OC2 in the non-display area, it is necessary to use a mask to etch off a part of the insulation layer where the first oxide conductor layer OC1 and the second oxide conductor layer OC2 will be electrically connected with each other before the second oxide conductor layer OC2 is formed. As for the structure shown in FIG. 6, it is necessary to etch off the part of the insulation layer, located between the first oxide conductor layer OC1 and the second oxide conductor layer OC2, corresponding to the positions of the connecting conductor 208a and the auxiliary connecting conductor 210a. Similarly, in the non-display area, in addition to the area shown in FIG. 6, the fourth insulation layer 229 can also be placed between the first oxide conductor layer OC1 and the second oxide conductor layer OC2 in other areas of the non-display area. Then, the area with the insulation layer between the first oxide conductor layer OC1 and the second oxide conductor layer OC2 is referred to as the first area, and the area without any insulation layer between the first oxide conductor layer OC1 and the second oxide conductor layer OC2 is referred to as the second area. The auxiliary connecting conductor 210a and the connecting conductor 208a are located in the second area, and an orthogonal projection of the second area on the base substrate 220 overlaps with an orthogonal projection of the through-hole 2264a of the planarization layer 2264 on the base substrate 220.

It should be noted that, in part of the embodiments provided in the present disclosure, the through-hole 2264a is defined in the planarization layer 2264, that is, the through-hole 2264a is not a deep hole which may penetrate through the planarization layer 2264, other film layer in the second insulation layer 226 and the third insulation layer 228 at the electrical connection position between the third metal layer M3 and the second metal layer M2, and the through-hole 2264a is not a deep hole which may penetrate through the planarization layer 2264, other film layer in the second insulation layer 226, the third insulation layer 228 and the fourth insulation layer 229 at the electrical connection between the third metal layer M3 and the second metal layer M2 either. By arranging the through-hole 2264a in the planarization layer 2264, it can avoid the connecting conductor 208a and the auxiliary connecting conductor 210a from crossing a possible deep hole, thereby reducing the probability that the connecting conductor 208a breaks.

According to an embodiment, the third metal layer M3 is electrically connected with the second metal layer M2 by the first oxide conductor layer OC1 and the second oxide conductor layer OC2, that is, the electrical connection between the touch electrode line 206 and the drain electrode 2024b of the antistatic thin-film transistor ET2 is realized by using the connecting conductor 208a and the auxiliary connecting conductor 210a, which further improves the stability of the electrical connection between the third metal layer M3 and the second metal layer M2. For example, due to the relatively great thickness of the insulation layer between the first oxide conductor layer OC1 and the second metal layer M2, and the connecting path of the insulation layer with the second metal layer M2 is relatively steep, and the first oxide conductor layer OC1 is generally thinner as compared with the second metal layer M2, therefore, the connecting conductor 208a located in the first oxide conductor layer OC1 readily breaks. However, the added auxiliary connecting conductor 210a is electrically connected with the connecting conductor 208a that may break, so as to improve the stability of the electrical connection between the third metal layer M3 (the touch electrode line 206) and the second metal layer M2 (the drain electrode 2024b of the antistatic thin-film transistor ET2). Therefore, the array substrate provided by the present embodiment can timely conduct away the static electricity on the touch electrode line 206 located in the third metal layer M3, and the static electricity on the touch electrode electrically connected with the touch electrode line 206, thereby preventing static damage and improving touch sensitivity.

It should be noted that, though the connecting conductor 208a in the present embodiment is not covered by an insulation layer, the connecting conductor 208a is covered by the auxiliary connecting conductor 210a. Thus, the present embodiment can also avoid the connecting conductor 208a connecting the third metal layer M3 (the touch electrode line 206) with the second metal layer M2 (the drain electrode 2024b of the antistatic thin-film transistor ET2) from being corroded in the subsequent processing procedures.

Figure 7:
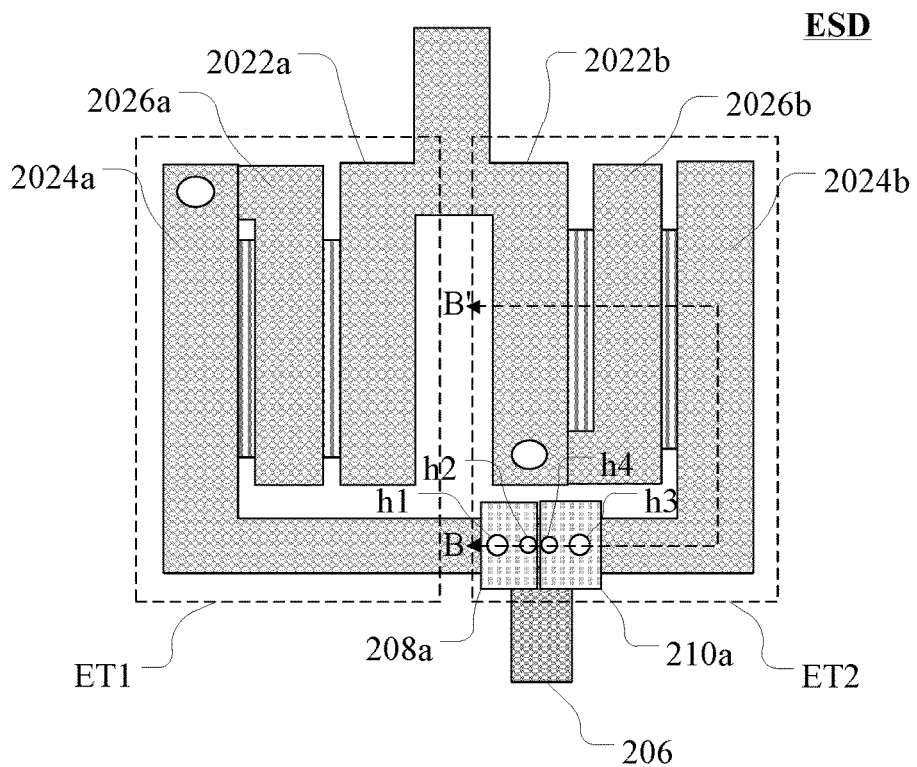
FIG. 7 illustrates another structural schematic diagram of an antistatic circuit unit in the non-display area of the array substrate shown in FIG. 1.
Figure 8:
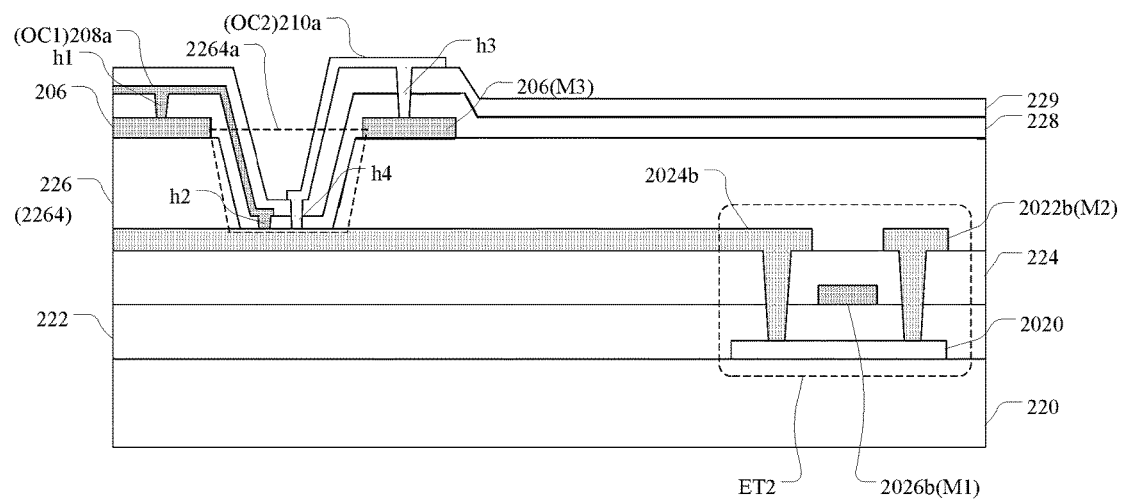
FIG. 8 illustrates a cross-sectional structural schematic diagram along BB' in FIG. 7.

Optionally, the third metal layer M3 is electrically connected with the second metal layer M2 by the first oxide conductor layer OC1 and the second oxide conductor layer OC2. For example, with reference to FIG. 7 and FIG. 8, FIG. 7 illustrates another structural schematic diagram of an antistatic circuit unit in the non-display area of the array substrate shown in FIG. 1, and FIG. 8 illustrates a cross-sectional structural schematic diagram along BB' in FIG. 7. The structure shown in FIG. 7 is similar to the structure shown in FIG. 4, the difference therebetween lies in the connection manner between the third metal layer M3 and the second metal layer M2, and the similar configurations are not repeated herein. The structure shown in FIG. 8 is similar to the structure shown in FIG. 6, the difference therebetween lies in the connection manner between the third metal layer M3 and the second metal layer M2, and the similar configurations are not repeated herein. As shown in FIG. 8, the connecting conductor 208a located in the first oxide conductor layer OC1 is connected with the touch electrode line 206 located in the third metal layer M3 through the first via-hole h1, and is connected with the drain electrode 2024b of the antistatic thin-film transistor ET2 located in the second metal layer M2 through the second via-hole h2; the auxiliary connecting conductor 210a located in the second oxide conductor layer OC2 is connected with the touch electrode line 206 located in the third metal layer M3 through the third via-hole h3, and is connected with the drain electrode 2024b of the antistatic thin-film transistor ET2 located in the second metal layer M2 through the fourth via-hole h4.

It should be noted that, as shown in FIG. 8, the non-display area further includes a fourth insulation layer 229, the first via-hole h1 extends through the third insulation layer 228, the second via-hole h2 extends through the third insulation layer 228 and the second insulation layer 226, the third via-hole h3 extends through the fourth insulation layer 229 and the third insulation layer 228, the fourth via-hole h4 extends through the fourth insulation layer 229, the third insulation layer 228 and the second insulation layer 226; orthogonal projections of the second via-hole h2 and the fourth via-hole h4 on the base substrate 220 overlap with an orthogonal projection of the through-hole 2264a of the planarization layer 2264 on the base substrate 220. For example, orthogonal projections of the second via-hole h2 and the fourth via-hole h4 on the planarization layer 2264 are located in the through-hole 2264a of the planarization layer 2264.

It should be noted that, in some embodiments provided in the present disclosure, the through-hole 2264a is defined in the planarization layer 2264, however, the through-hole 2264a is not a deep hole which may extend through the planarization layer 2264, other film layer in the second insulation layer 226 and the third insulation layer 228 at the electrical connection between the third metal layer M3 and the second metal layer M2. By arranging such through-hole 2264a merely defined in the planarization layer 2264, it can avoid the connecting conductor 208a from crossing the deep hole, thereby reducing the probability that the connecting conductor 208a breaks.

According to an embodiment, the touch electrode line 206 located in the third metal layer M3 is electrically connected with the drain electrode 2024b of the antistatic thin-film transistor ET2 located in the second metal layer M2 by the connecting conductor 208a located in the first oxide conductor layer OC1 and the auxiliary connecting conductor 210a located in the second oxide conductor layer OC2, and the first oxide conductor layer OC1 and the second oxide conductor layer OC2 are further provided with the fourth insulation layer 229 therebetween, which can not only prevent the connecting conductor 208a from be corroded in the subsequent processing procedures, but also improve stability of the electrical connection. It should be noted that, the electrical connection between the third metal layer M3 and the second metal layer M2 can be realized by either the connecting conductor 208a or the auxiliary connecting conductor 210a. However, by using a combination of the connecting conductor 208a and the auxiliary connecting conductor 210a, if the connecting conductor 208a breaks, the auxiliary connecting conductor 210a can help to realize the electrical connection between the third metal layer M3 and the second metal layer M2. Therefore, the array substrate provided by the present embodiment can timely conduct away the static electricity on the touch electrode line 206 located in the third metal layer M3, and the static electricity on the touch electrode electrically connected with the touch electrode line 206, thereby preventing from static damage and improving touch sensitivity.

For illustration convenience, the above-described manner in which the touch electrode line is electrically connected with the antistatic circuit also illustrates a connection manner between the third metal layer M3 and the second metal layer M2. However, the embodiment of the present disclosure is not limited thereto, and the third metal layer M3 can also be electrically connected with the second metal layer M2 in other manner provided in the present disclosure. In order to better understand the present disclosure, the following description exemplarily illustrates how the touch electrode line is electrically connected with a control portion. The control portion can be a driving chip (also called as Integrated Circuit, IC) or a flexible circuit board (Flexible Printed Circuit, FPC), etc. For example, the array substrate further includes a control portion located in the non-display area, and each of the first metal layer M1, the second metal layer M2 and the third metal layer M3 is electrically connected with the control portion.

Figure 9:
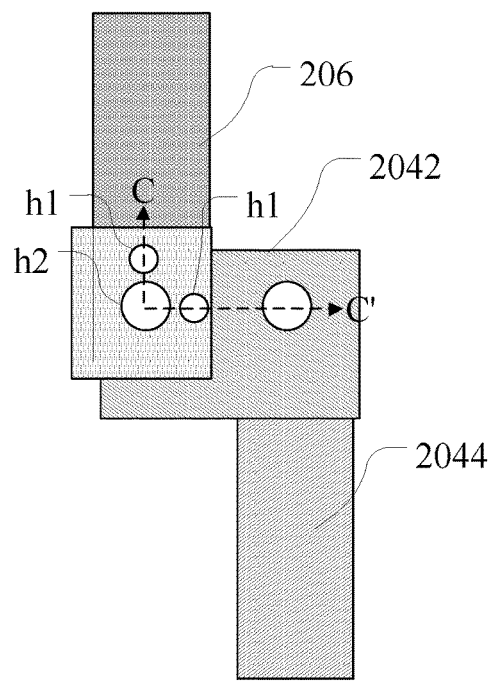
FIG. 9 illustrates a structural schematic diagram of the non-display area of the array substrate shown in FIG. 1 at a wire changing position of a third metal layer.

With reference to FIG. 1 and FIG. 9, FIG. 9 illustrates a structural schematic diagram of the non-display area of the array substrate shown in FIG. 1 at a wire changing position of a third metal layer. In the non-display area 20 of the array substrate shown in FIG. 1, the display area 10 and the driving chip IC are provided with a wire changing area 204 therebetween, and the wire changing area 204 is an area where conduction wires of different layers electrically connect with each other so as to change wire. The electrical connection between the third metal layer M3 and the driving chip IC is realized by a wire changing manner. That is, as shown in FIG. 9, the touch electrode line 206 located in the third metal layer M3 will have to change wire by a wire changing electrode block 2042 to be able to electrically connect with the driving lead wire 2044 located in the first metal layer M1, and the driving lead wire 2044 is electrically connected with the driving chip IC directly. It should be noted that, FIG. 9 merely illustrates an embodiment of the present disclosure, in other embodiments, the driving lead wire 2044 directly and electrically connected with the driving chip IC can also be located in the second metal layer M2; or the driving lead wire 2044 is not electrically connected with the driving chip IC, but is directly and electrically connected with the flexible circuit board.

Figure 10:
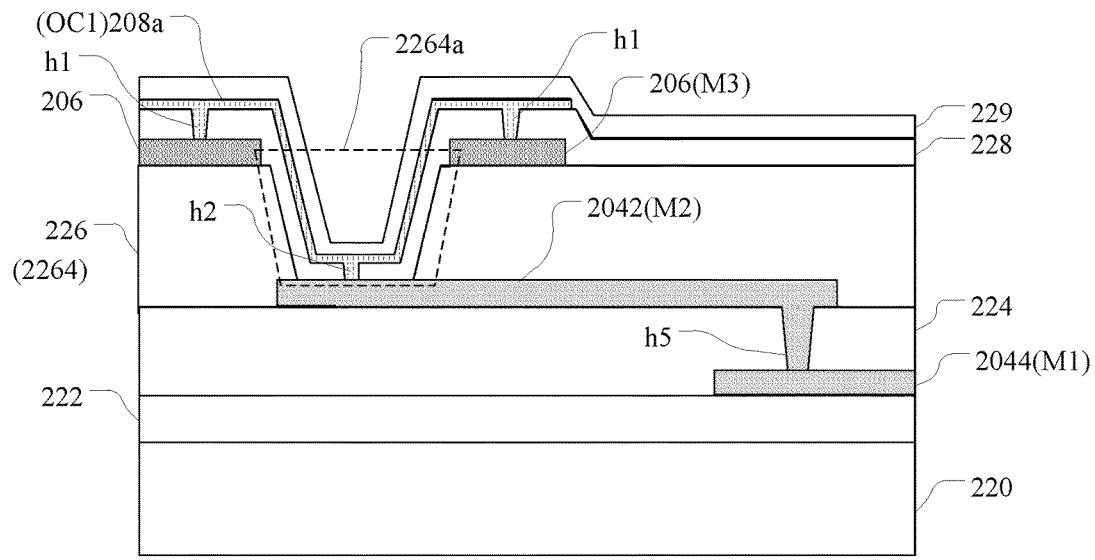
FIG. 10 illustrates a cross-sectional structural schematic diagram along CC' in FIG. 9.

The wire changing manner of touch electrode line 206 can refer to FIG. 10. FIG. 10 illustrates a cross-sectional structural schematic diagram along CC' in FIG. 9. The connection manner between the third metal layer M3 and the second metal layer M2 shown in FIG. 10 is the same as that shown in FIG. 5, which is not repeated herein. As shown in FIG. 10, the connecting conductor 208a located in the first oxide conductor layer OC1 is connected with the touch electrode line 206 located in the third metal layer M3 through the first via-hole h1, and the connecting conductor 208a located in the first oxide conductor layer OC1 is connected with the wire changing electrode block 2042 located in the second metal layer through the second via-hole h2. The first via-hole h1 extends through the third insulation layer 228, and the second via-hole h2 extends through the second insulation layer 226 and the third insulation layer 228. The touch electrode line 206 is electrically connected with the wire changing electrode block 2042 in the above described manner, the wire changing electrode block 2042 located in the second metal layer M2 is electrically connected with the driving lead wire 2044 located in the first metal layer M1 through a fifth via-hole h5, so as to realize the electrical connection between the touch electrode line 206 located in the third metal layer M3 with the driving lead wire 2044 located in the first metal layer M1. It should be noted that, the fourth insulation layer 229 is placed at a side of the connecting conductor 208a away from the base substrate 220. In the present embodiment, the electrical connection between the touch electrode line 206 and the wire changing electrode block 2042 is realized by the connecting conductor

208a located at a side of the fourth insulation layer 229 close to the base substrate 220, which prevents the connecting conductor 208a from being corroded in the subsequent processing procedures, thereby improving stability of the electrical connection between the touch electrode line 206 and the driving chip IC, and thus improving the touch sensitivity.

Figure 11:
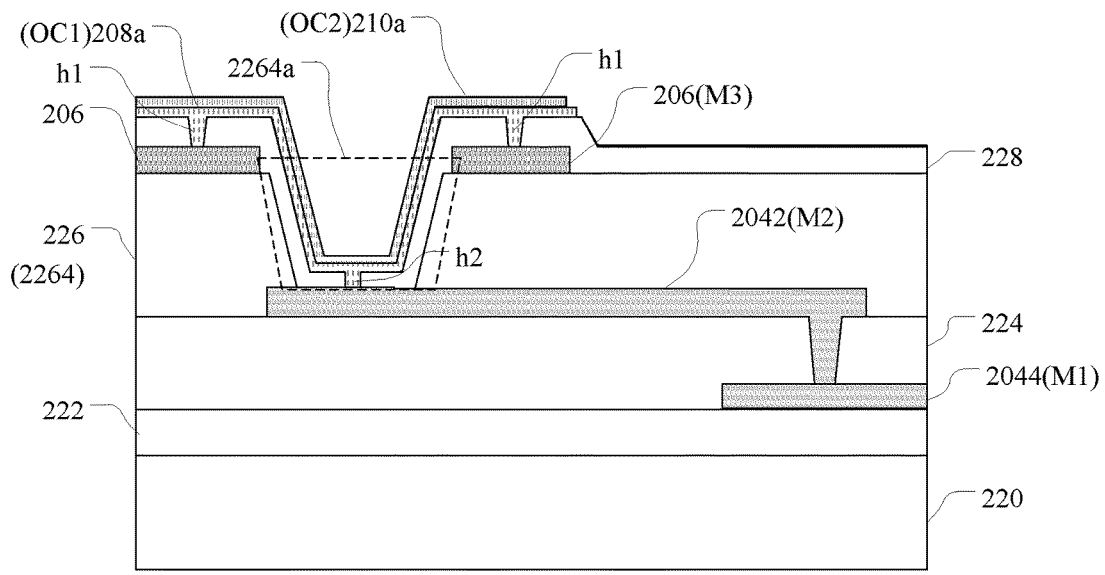
FIG. 11 illustrates another cross-sectional structural schematic diagram along CC' in FIG. 9.

Optionally, the wire changing manner of the touch electrode line 206 can also refer to FIG. 11. FIG. 11 illustrates another cross-sectional structural schematic diagram along CC' in FIG. 9. The connection manner between the third metal layer M3 and the second metal layer M2 in FIG. 11 is the same as that shown in FIG. 6, the similar arrangement is not repeated herein. As shown in FIG. 11, the connecting conductor 208a located in the first oxide conductor layer OC1 is connected with the touch electrode line 206 located in the third metal layer M3 through the first via-hole h1, and the connecting conductor 208a located in the first oxide conductor layer OC1 is connected with the wire changing electrode block 2042 located in the second metal layer through the second via-hole h2. The first via-hole h1 extends through the third insulation layer 228, and the second via-hole h2 extends through the second insulation layer 226 and the third insulation layer 228. The auxiliary connecting conductor 210a located in the second oxide conductor layer OC2 directly contacts with the connecting conductor 208a. The touch electrode line 206 is electrically connected with the wire changing electrode block 2042 in the above described manner, and the wire changing electrode block 2042 located in the second metal layer M2 is electrically connected with the driving lead wire 2044 located in the first metal layer M1 through the fifth via-hole h5, so as to realize the electrical connection between the touch electrode line 206 located in the third metal layer M3 and the driving lead wire 2044 located in the first metal layer M1. In the present embodiment, the stability of the electrical connection between the touch electrode line 206 and the driving chip IC is improved in a way that the auxiliary connecting conductor 210a directly contacts with the connecting conductor 208a, thereby improving the touch sensitivity.

It should be noted that, FIG. 11 merely illustrates a partial configuration of the array substrate placed by the present embodiment. In the display area of the array substrate, an insulation layer is placed between the first oxide conductor layer OC1 and the second oxide conductor layer OC2. For example, as shown in FIG. 2 or FIG. 3, the first oxide conductor layer OC1 and the second oxide conductor layer OC2 are provided a fourth insulation layer 229 therebetween. Similarly, in the non-display area, beside the area shown in FIG. 10, other areas of the non-display area can also be provided with the fourth insulation layer 229 between the first oxide conductor layer OC1 and the second oxide conductor layer OC2. Then, the area having an insulation layer between the first oxide conductor layer OC1 and the second oxide conductor layer OC2 can be referred to as a first area, and the area without an insulation layer between the first oxide conductor layer OC1 and the second oxide conductor layer OC2 can be referred to as a second area. The auxiliary connecting conductor 210a and the connecting conductor 208a are located in the second area, and an orthogonal projection of the second area on the base substrate 220 overlaps with an orthogonal projection of the through-hole 2264a defined in the planarization layer 2264 on the base substrate 220.

Figure 12:
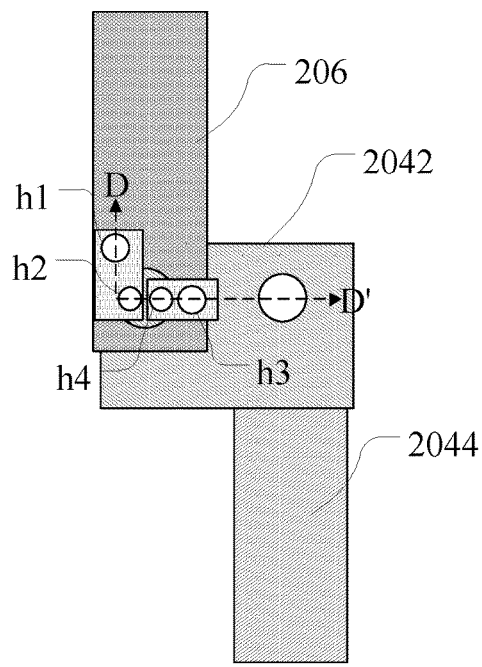
FIG. 12 illustrates another structural schematic diagram of the non-display area of the array substrate shown in FIG. 1 at a wire changing position of a third metal layer.
Figure 13:
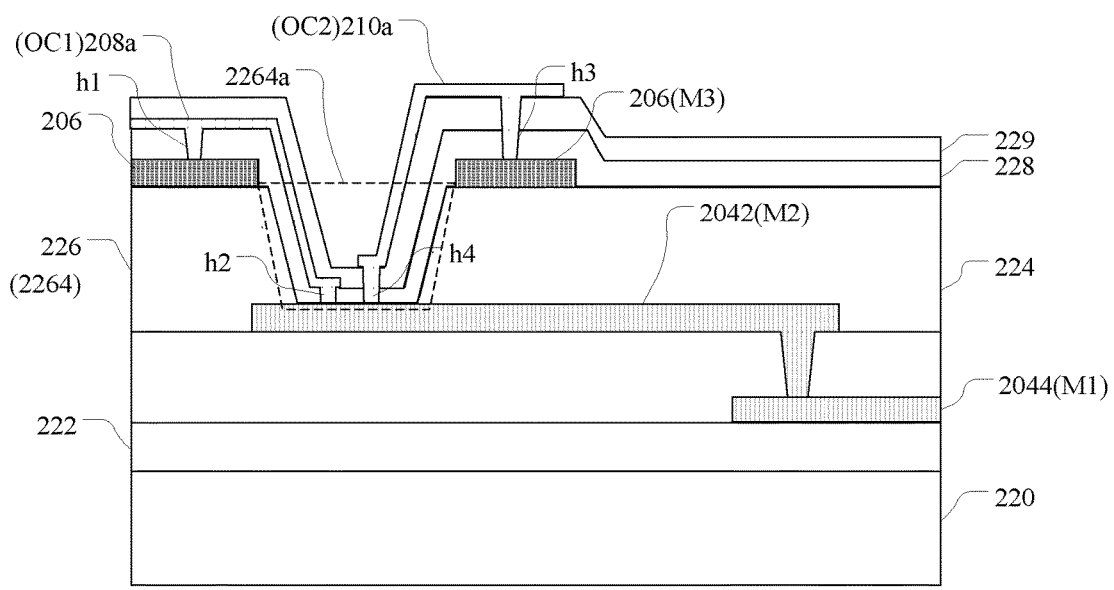
FIG. 13 illustrates a cross-sectional structural schematic diagram along DD' in FIG. 12.

Optionally, the wire changing manner of the touch electrode line 206 can refer to FIG. 12 and FIG. 13. FIG. 12 illustrates another structural schematic diagram of the non-display area of the array substrate shown in FIG. 1 at a wire changing position of a third metal layer. FIG. 13 illustrates a cross-sectional structural schematic diagram along DD' in FIG. 12. The connection manner between the third metal layer M3 and the second metal layer M2 shown in FIG. 13 is the same as that shown in FIG. 8, the similar configuration of which is not repeated herein. As shown in FIG. 13, the connecting conductor 208a located in the first oxide conductor layer OC1 is connected with the touch electrode line 206 located in the third metal layer M3 through the first via-hole h1, and is connected with the wire changing electrode block 2042 located in the second metal layer M2 through the second via-hole h2. The auxiliary connecting conductor 210a located in the second oxide conductor layer OC2 is connected with the touch electrode line 206 located in the third metal layer M3 through the third via-hole h3, and is connected with the wire changing electrode block 2042 located in the second metal layer M2 through the fourth via-hole h4. The fourth insulation layer 229 is placed between the connecting conductor 208a and the auxiliary connecting conductor 210a. The touch electrode line 206 is electrically connected with the wire changing electrode block 2042 in the above-described manner, and the wire changing electrode block 2042 located in the second metal layer M2 is electrically connected with the driving lead wire 2044 located in the first metal layer M1 through the fifth via-hole h5, so as to realize the electrical connection between the touch electrode line 206 located in the third metal layer M3 and the driving lead wire 2044 located in the first metal layer M1. In the present embodiment, the connecting conductor 208a located in the first oxide conductor layer OC1 and the auxiliary connecting conductor 210a located in the second oxide conductor layer OC2 are used to connect with the touch electrode line 206 located in the third metal layer M3, and the wire changing electrode block 2042 located in the second metal layer M2, respectively. The connecting conductor 208a is protected by the fourth insulation layer 229 so as to avoid corrosion in the subsequent processing procedures while the auxiliary connecting conductor 210a enhances the stability of the electrical connection, thereby further improving the touch sensitivity of the array substrate.

The above-described embodiment is exemplarily illustrated by a situation that the second insulation layer 226 merely includes the planarization layer 2264, however, the embodiment is not limited thereto. In other embodiments, the second insulation layer 226 may include both the planarization layer 2264 and other interbedded insulation layer. The connection manner between the touch electrode line and the control portion is illustrated as follows as an example.

Figure 14:
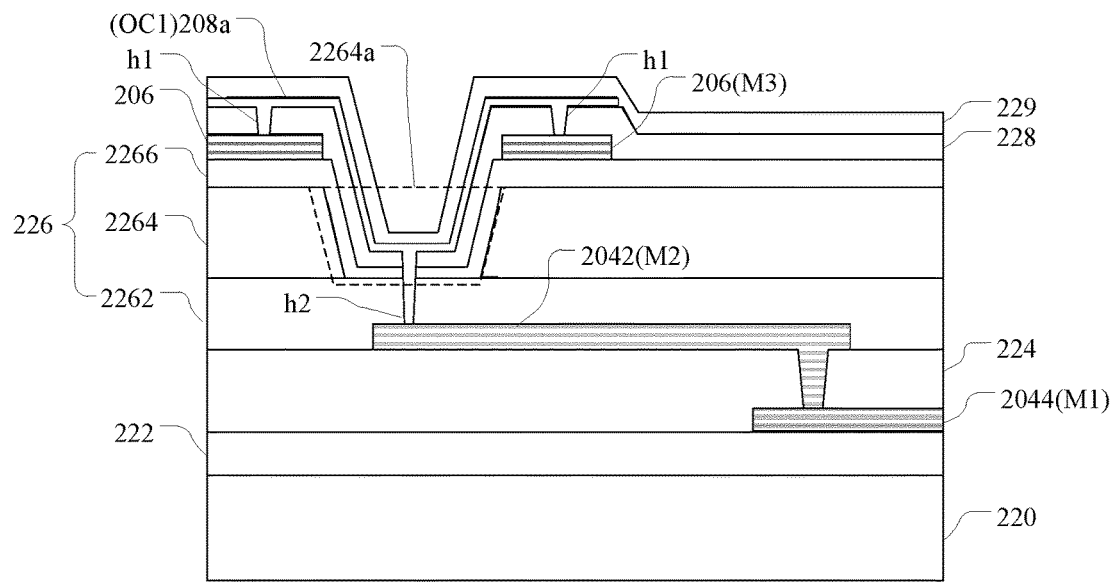
FIG. 14 illustrates still another cross-sectional structural schematic diagram along CC' in FIG. 9.

With reference to FIG. 14, FIG. 14 illustrates another cross-sectional structural schematic diagram along CC' in FIG. 9. The connection manner between the third metal layer M3 and the second metal layer M2 shown in FIG. 14 is the same as that shown in FIG. 10, the similar configuration of which is not repeated herein. A shown in FIG. 14, the second insulation layer 226 includes a planarization layer 2264, a first interbedded insulation layer 2262 and a second interbedded insulation layer 2266. The first interbedded insulation layer 2262 is located between the second metal layer M2 and the planarization layer 2264, and the second interbedded insulation layer 2266 is located between the planarization layer 2264 and the third metal layer M3. Then, it is necessary for the second via-hole h2 to extend through the first interbedded insulation layer 2262 and the second interbedded insulation layer 2266. Since the through-hole 2264a of the planarization layer 2264 is formed before the third metal layer M3 is formed, and a part of the second metal layer M2 that needs to be electrically connected with the third metal layer M3 has already been exposed via the through-hole 2264a, the part of the second metal layer M2 located in the through-hole 2264a will be corroded when the third metal layer M3 is etched. However, the first interbedded insulation layer 2262 and the second interbedded insulation layer 2266 provided in the present embodiment can prevent the second metal layer M2 from being corroded during etching of the third metal layer, thereby improving the stability of the electrical connection between the third metal layer M3 and the second metal layer M2.

It should be noted that, the structure shown in FIG. 14 is merely exemplary, in other embodiments, the number of the interbedded insulation layer located in the second insulation layer 226 may be one or more, the present disclosure has no limitation thereon, and number of the interbedded insulation layer can be selected according to actual production demands.

It should be noted that, in the structures shown in FIG. 5, FIG. 6, FIG. 8, FIG. 10, FIG. 11 and FIG. 13, the second insulation layer 226 can also include one or more interbedded insulation layer. Regardless of the number of the interbedded insulation layer in the second insulation layer 226 is, it is necessary for the through-hole located between the connecting conductor 208a and the second metal layer M2 to penetrate through each interbedded insulation layer, and/or, it is necessary for the through-hole located between the auxiliary connecting conductor 210a and the second metal layer M2 to penetrate through each interbedded insulation layer.

Figure 15:
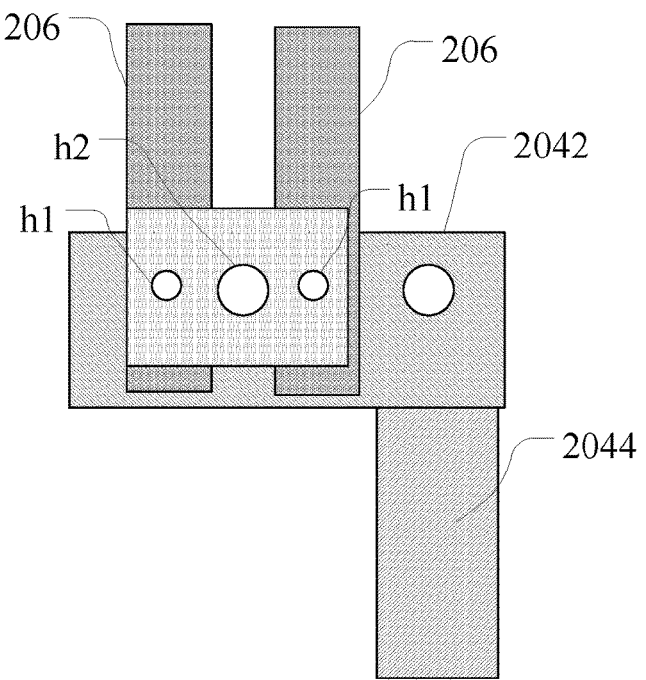
FIG. 15 illustrates another structural schematic diagram of the non-display area of the array substrate shown in FIG. 1 at a wire changing position of a third metal layer.

In addition, the wire changing manner of the touch electrode line 206 can also refer to FIG. 15. FIG. 15 illustrates still another structural schematic diagram of the non-display area of the array substrate shown in FIG. 1 at a wire changing position of a third metal layer. It should be noted that, the configuration of the wire changing position shown in FIG. 15 is similar to that shown in FIG. 9, the difference thereof lies in that the wire changing electrode block 2042 is electrically connected with two touch electrode lines 206, and the similar portions are not repeated herein. It should be noted that, in FIG. 15, the two touch electrode lines 206 electrically connected with the wire changing electrode block 2042 are electrically connected with a same touch electrode block (common electrode block) in the display area. In other embodiments, if one touch electrode block is electrically connected with a plurality of touch electrode lines 206, the plurality of touch electrode lines 206 will be electrically connected with a same wire changing electrode block 2042 at the wire changing position.

Similarly, in the above embodiments, the through-hole 2264a is defined in the planarization layer 2264 of the touch electrode line 206 at the wire changing position. The through-hole 2264a is different from a deep hole that may penetrate through the planarization layer 2264, other film layer in the second insulation layer 226 and the third insulation layer 228 at the electrical connection of the third metal layer M3 and the second metal layer M2, thereby avoiding the connecting conductor 208a from crossing the deep hole; and/or, The through-hole 2264a is different form a deep hole that may penetrate through the planarization layer 2264, other film layer in the second insulation layer 226, the third insulation layer 228 and the fourth insulation layer 229 at the electrical connection position of the third metal layer M3 and the second metal layer M2, thereby avoiding the auxiliary connecting conductor 210a from crossing the deep hole. Therefore, the array substrate provided by the present embodiment can reduce the probability that the connecting conductor 208a breaks.

Figure 16:
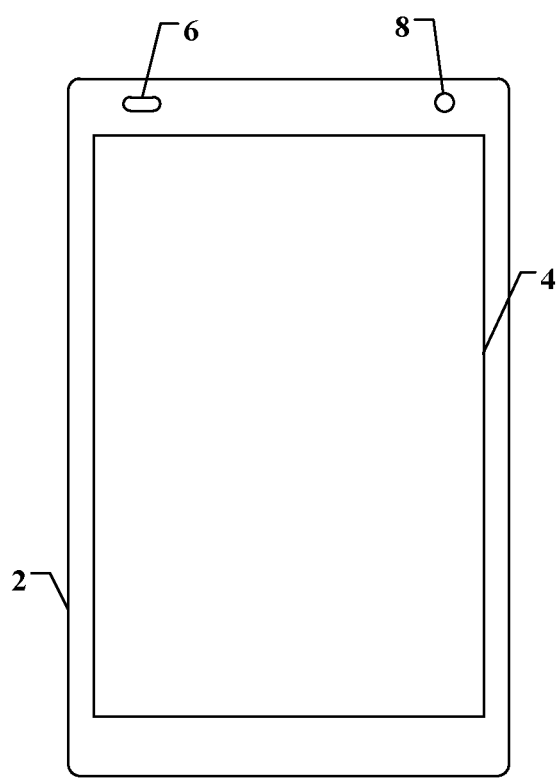
FIG. 16 illustrates a structural schematic diagram of a display device according to an embodiment of the present disclosure.

The present disclosure further provides a display device. As shown in FIG. 16, FIG. 16 illustrates a structural schematic diagram of a display device according to an embodiment of the present disclosure. The display device includes a housing 2, a display panel 4, a camera 6 and a signal light 8. The display panel 4 includes the array substrate as described in any of the above-described embodiments. Since the anti-corrosion and the stability of electrical connection between the touch electrode line located in the third metal layer M3 and the second metal layer M2 in the array substrate is improved, the touch sensitivity and service life of the display device is improved accordingly.

The embodiments of the present disclosure are described as above in a progressive way. The detailed description in each embodiment illustrates the differences from other embodiments, and the same or similar features of the embodiments can refer to the embodiments mutually. As for the method disclosed in the embodiment, it is simply illustrated as it corresponds to the disclosed structure, and the details thereof can refer to the description of the structure.

Those skilled in the art can implement and utilize the present disclosure with reference to the embodiments described above. Of course, those skilled in the art can make various modifications to those embodiments, and the general principles of the present disclosure can also be implemented in other embodiments without departing from the spirit and scope of the present disclosure. That is, the present disclosure is not limited to those embodiments, but should be interpreted to have the broadest protection scope in conformity with the principles and innovations disclosed in the present disclosure.

What is claimed is:

1. An array substrate, comprising:
   a base substrate, the base substrate comprising a display area and a non-display area;
   a first metal layer, located in the display area and the non-display area;
   a second metal layer, located at a side of the first metal layer away from the base substrate;
   a third metal layer, located at a side of the second metal layer away from the base substrate;
   a first insulation layer, placed between the first metal layer and the second metal layer;
   a second insulation layer, placed between the second metal layer and the third metal layer;
   a first oxide conductor layer, located at a side of the third metal layer away from the base substrate;
   a second oxide conductor layer, located at a side of the first oxide conductor layer away from the base substrate;
   a third insulation layer, located between the first oxide conductor layer and the third metal layer; and
   a fourth insulation layer;
   wherein in the display area, the fourth insulation layer is placed between the first oxide conductor layer and the second oxide conductor layer; in the non-display area, the third metal layer is electrically connected with the second metal layer at least by the first oxide conductor layer.

2. The array substrate according to claim 1, wherein the second insulation layer comprises a planarization layer, a through-hole is defined through the planarization layer, an orthogonal projection of the through-hole on the base substrate overlaps an orthogonal projection of the second metal layer on the base substrate.

3. The array substrate according to claim 2, wherein a groove is further defined in the planarization layer.

4. The array substrate according to claim 2, wherein a first via-hole is defined through the third insulation layer, a second via-hole is defined through the second insulation layer and the third insulation layer, an orthogonal projection of the second via-hole on the base substrate overlaps the orthogonal projection of the through-hole defined in the planarization layer on the base substrate, the third metal layer is connected with the first oxide conductor layer through the first via-hole, and the second metal layer is connected with the first oxide conductor layer through the second via-hole.

5. The array substrate according to claim 4, wherein the third metal layer is electrically connected with the second metal layer by the first oxide conductor layer and the second oxide conductor layer.

6. The array substrate according to claim 5, wherein the second oxide conductor layer comprises a first area and a second area;
wherein in the first area, the fourth insulation layer is placed between the second oxide conductor layer and the first oxide conductor layer; in the second area, the second oxide conductor layer contacts the first oxide conductor layer; and an orthogonal projection of the second area on the base substrate overlaps the orthogonal projection of the through-hole defined in the planarization layer on the base substrate.

7. The array substrate according to claim 5, wherein a third via-hole is defined through the fourth insulation layer and the third insulation layer, a fourth via-hole is defined through the fourth insulation layer, the third insulation layer and the second insulation layer, and an orthogonal projection of the fourth via-hole on the base substrate overlaps the orthogonal projection of the through-hole defined in planarization layer on the base substrate; the fourth insulation layer is further placed in the non-display area, the second oxide conductor layer is connected with the third metal layer through the third via-hole, and the second oxide conductor layer is connected with the second metal layer through the fourth via-hole.

8. The array substrate according to claim 1, further comprising:
a plurality of display thin-film transistors in the display area,
a plurality of data lines in the display area,
a plurality of gate lines in the display area, and
a plurality of touch electrode lines in the display area;
wherein the display thin-film transistor comprises a gate electrode, and a source electrode, and a drain electrode; the gate electrode of the display thin-film transistor and the plurality of gate lines are placed in the first metal layer, the source electrode, the drain electrode and the plurality of data lines are placed in the second metal layer, and the plurality of touch electrode lines is placed in the third metal layer.

9. The array substrate according to claim 2, further comprising:
a plurality of display thin-film transistors in the display area,
a plurality of data lines in the display area,
a plurality of gate lines in the display area, and
a plurality of touch electrode lines in the display area;
wherein the display thin-film transistor comprises a gate electrode, and a source electrode, and a drain electrode; the gate electrode of the display thin-film transistor and the plurality of gate lines are placed in the first metal layer, the source electrode, the drain electrode and the plurality of data lines are placed in the second metal layer, and the plurality of touch electrode lines is placed in the third metal layer.

10. The array substrate according to claim 3, further comprising:
a plurality of display thin-film transistors in the display area,
a plurality of data lines in the display area,
a plurality of gate lines in the display area, and
a plurality of touch electrode lines in the display area;
wherein the display thin-film transistor comprises a gate electrode, and a source electrode, and a drain electrode; the gate electrode of the display thin-film transistor and the plurality of gate lines are placed in the first metal layer, the source electrode, the drain electrode and the plurality of data lines are placed in the second metal layer, and the plurality of touch electrode lines is placed in the third metal layer.

11. The array substrate according to claim 4, further comprising:
a plurality of display thin-film transistors in the display area,
a plurality of data lines in the display area,
a plurality of gate lines in the display area, and
a plurality of touch electrode lines in the display area;
wherein the display thin-film transistor comprises a gate electrode, and a source electrode, and a drain electrode; the gate electrode of the display thin-film transistor and the plurality of gate lines are placed in the first metal layer, the source electrode, the drain electrode and the plurality of data lines are placed in the second metal layer, and the plurality of touch electrode lines is placed in the third metal layer.

12. The array substrate according to claim 8, wherein the first oxide conductor layer serves as a pixel electrode and the second oxide conductor layer serves as a common electrode; or the first oxide conductor layer serves as a common electrode and the second oxide conductor layer serves as a pixel electrode.

13. The array substrate according to claim 12, wherein the common electrode is further used as a touch electrode and the touch electrode is electrically connected with the plurality of touch electrode lines in the display area.

14. The array substrate according to claim 1, further comprising an antistatic circuit placed in the non-display area, wherein the antistatic circuit comprises an antistatic thin-film transistor, the antistatic thin-film transistor comprises a gate electrode, a source electrode, and a drain electrode, the gate electrode of the antistatic thin-film transistor is placed in the first metal layer, and the source electrode and the drain electrode of the antistatic thin-film transistor are placed in the second metal layer.

15. The array substrate according to claim 2, further comprising an antistatic circuit placed in the non-display area, wherein the antistatic circuit comprises an antistatic thin-film transistor, the antistatic thin-film transistor comprises a gate electrode, a source electrode, and a drain electrode, the gate electrode of the antistatic thin-film transistor is placed in the first metal layer, and the source electrode and the drain electrode of the antistatic thin-film transistor are placed in the second metal layer.

16. The array substrate according to claim 3, further comprising an antistatic circuit placed in the non-display area, wherein the antistatic circuit comprises an antistatic thin-film transistor, the antistatic thin-film transistor comprises a gate electrode, a source electrode, and a drain electrode, the gate electrode of the antistatic thin-film transistor is placed in the first metal layer, and the source electrode and the drain electrode of the antistatic thin-film transistor are placed in the second metal layer.

17. The array substrate according to claim 4, further comprising an antistatic circuit placed in the non-display area, wherein the antistatic circuit comprises an antistatic thin-film transistor, the antistatic thin-film transistor comprises a gate electrode, a source electrode, and a drain electrode, the gate electrode of the antistatic thin-film transistor is placed in the first metal layer, and the source electrode and the drain electrode of the antistatic thin-film transistor are placed in the second metal layer.

18. The array substrate according to claim 1, further comprising:
    a control portion located in the non-display area;
    wherein each of the first metal layer, the second metal and the third metal layer is electrically connected with the control portion.

19. The array substrate according to claim 18, wherein the third metal layer is electrically connected with the control portion by the second metal layer and the first metal layer; wherein the third metal layer is electrically connected with the second metal layer, and the second metal layer is electrically connected with the first metal layer through a fifth via-hole.

20. A display device, comprising an array substrate according, wherein the array substrate comprises:
    a base substrate, the base substrate comprising a display area and a non-display area;
    a first metal layer, located in the display area and the non-display area;
    a second metal layer, located at a side of the first metal layer away from the base substrate;
    a third metal layer, located at a side of the second metal layer away from the base substrate;
    a first insulation layer, placed between the first metal layer and the second metal layer;
    a second insulation layer, placed between the second metal layer and the third metal layer;
    a first oxide conductor layer, located at a side of the third metal layer away from the base substrate;
    a second oxide conductor layer, located at a side of the first oxide conductor layer away from the base substrate;
    a third insulation layer, located between the first oxide conductor layer and the third metal layer; and
    a fourth insulation layer;
    wherein in the display area, the fourth insulation layer is placed between the first oxide conductor layer and the second oxide conductor layer; in the non-display area, the third metal layer is electrically connected with the second metal layer at least by the first oxide conductor layer.

* * * * *